United States Patent [19]

Kawasima

[11] Patent Number: 5,455,787
[45] Date of Patent: Oct. 3, 1995

[54] SEMICONDUCTOR MEMORY DEVICE

[75] Inventor: Shoichiro Kawasima, Kawasaki, Japan

[73] Assignee: Fujitsu Limited, Kawasaki, Japan

[21] Appl. No.: 202,249

[22] Filed: Feb. 25, 1994

[30] Foreign Application Priority Data

Mar. 19, 1993 [JP] Japan .................................. 5-085371

[51] Int. Cl.⁶ .................................................. H01L 27/11
[52] U.S. Cl. ..................... 365/154; 365/51; 365/188;
365/63; 365/72; 257/210; 257/208
[58] Field of Search ........................ 365/221, 182,
365/185, 189.09, 154, 51, 188, 63, 72;
257/377, 208, 210

[56] References Cited

U.S. PATENT DOCUMENTS

| 4,780,851 | 10/1988 | Kurakami | 365/200 |
| 4,950,620 | 8/1990 | Harrington, III | 437/60 |
| 5,241,495 | 8/1993 | Sasaki | 365/51 |
| 5,627,192 | 11/1993 | Nogami | 365/154 |

OTHER PUBLICATIONS

IEEE Journal of Solid State Circuits, 1992, 27:1490–1496, Goto et al. A 3.3–V 12–na 16–Mb CMOS SRAM.
IEEE Journal of Solid state Circuits, 1992, 27:1497–1503, Matsumiya et al. A 15–ns 16 Mb CMOS SRAM with Interdigitated Bit–Line Architecture.

*Primary Examiner*—Viet Q. Nguyen
*Attorney, Agent, or Firm*—Armstrong, Westerman, Hattori, McLeland and Naughton

[57] ABSTRACT

A semiconductor memory device comprises a layout of a plurality of memory cells each including a pair of device regions, a pair of driver transistors respectively formed on the respective device regions of the pair and having gates and drains thereof cross-connected to each other, a pair of transfer transistors respectively formed on the respective device regions of the pair and controlled by a word line, a pair of load devices respectively disposed in the respective driver transistors of the pair, the pair of transfer transistors having a gate layer formed on the pair of device regions; and the word line being formed so as to cross the pair of driver transistors thereabove and being in contact with the gate layer of the pair of transfer transistors. No region is necessary for mask alignment between the word lines and the gate layer, and an area of a memory cell can be reduced.

28 Claims, 16 Drawing Sheets

$r_c > r_1$ $r_c < r_1$

SEMICONDUCTOR MEMORY DEVICE

BACKGROUND OF THE INVENTION

The present invention relates to a semiconductor memory device, particularly to a static RAM using memory cells based on flip-flops.

Recently higher-density static RAMs are increasingly demanded, and it is required to further diminish the memory cells.

A static RAM of FIGS. 15, and 16A to 16C has been proposed. FIG. 15 shows the general fabrication of the proposed static RAM, and FIGS. 16A to 16C show the constitution of the respective memory cells. FIG. 15 is a general plan view of the memory cell, FIG. 16A is a plan view of the respective memory cells, FIG. 16B is a sectional view of the respective memory cells along the line D–D', and FIG. 16C is the circuit diagram of the respective memory cells.

As shown in FIGS. 16A to 16C, each memory cell has a pair of device regions 104, 105 defined by a field oxide film 102 on a p-semiconductor substrate 100. A driver transistor D1 and a transfer transistor T1 are formed in the one device region 104, and a driver transistor D2 and a transfer transistor T2 are formed in the other device region 105.

In the device region 104 a gate layer 108 for the driver transistor D1 is formed through a gate oxide film 106, and a gate layer 109 for the driver transistor D2 is formed through a gate oxide film 106 in the device region 105. The gate layer 108 crosses the drive region 104 forming the driver transistor D1 and arrives at the other device region 105 to be in contact with an n-doped region 110. Similarly the gate layer 109 crosses the device region 105 forming the driver transistor D2 and arrives at the device region 104 to be in contact with an n-doped region 110.

A Vss contact 112 which is connected to a source wire (not shown) is formed in the n-doped region 110 adjacent to a channel region of the driver transistor D1 of the device region 104. Similarly a Vss contact 113 which is connected to a source wire (not shown) is formed in the n-doped region 110 adjacent to a channel region of the driver transistor D2 in the device region 105.

In the device region 104 a word line 114 is formed across the device region 104 through the gate oxide film 106 and functions also as a gate layer of the transfer transistor T1. In the device region 105 a word line 115 is formed across the device region 105 through the gate oxide film 106 and functions also as a gate layer of the transfer transistor T2.

A word line WL of aluminium is formed on the top layers of the word lines 114, 115. Each word line WL is in contact with the word lines 114, 115 of a set number of memory cells so that the word lines 114, 115 are less resistivity.

A bit line contact 116 which is in contact with a bit line BL is formed in the n-doped region 110 adjacent to the channel region of the transfer transistor T1 of the device region 104. Similarly a bit line contact 117 which is in contact with a bit line $\overline{BL}$ is formed in the n-doped region 110 adjacent to the channel region of the transfer transistor T2.

A TFT (Thin Film Transistor) load device (not shown) is provided above the driver transistors D1, D2 of each memory cell.

As shown in FIG. 15, a number of memory cells of FIGS. 16A to 16C are arranged in a matrix. A pair of word lines 114, 115 are formed over adjacent ones of the memory cells.

But in the above-described static RAM the word lines 114, 115 function as the gate layers of the transfer transistors T1, T2 and are formed of the same polycrystalline silicon layer as the gate layers 108, 109 of the driver transistors D1, D2. This has made it difficult to reduce the memory cell area.

As shown in FIG. 16A, gaps (G1) of, e.g., about 0.5 μm are necessary between ends of the gate layers 108, 109, and edges of the word lines 114, 115 for patterning of the polycrystalline silicon layer.

The gate layers 108, 109 require about 0.5 μm-projections (G2) at ends thereof in consideration of allowances for aligning masks for patterns for forming the gate layers 108, 109 and the device regions 104, 105.

To these ends it is necessary to design the word lines 114, 115 and the device regions 104, 105 so as to be spaced from each other by an about 1.0 μm distance (=Gi+G2).

Thus the above-described static RAM requires the useless region for the mask alignment, which results in a problem that each memory cell needs a large area. Reduction of an area of each memory cell results in a problem that the driver transistors D1, D2 have small channel widths and have insufficient drive ability.

Furthermore, in the above-described static RAM each memory cell requires two word lines, which needs a larger area.

SUMMARY OF THE INVENTION

A first object of the present invention is to provide a semiconductor memory device which each memory cell does not require a large area for a region for the mask alignment.

A second object of the present invention is to provide a semiconductor memory device which requires only one word line for each memory cell.

The first object of the present invention can be achieved by a semiconductor memory device comprising a layout of a plurality of memory cells each including a pair of device regions, a pair of driver transistors respectively formed on the respective device regions of the pair and having gates and drains thereof cross-connected to each other, a pair of transfer transistors respectively formed on the respective device regions of the pair and controlled by a word line, a pair of load devices respectively disposed above the respective driver transistors of the pair, the pair of transfer transistors having a gate layer formed on the pair of device regions; and the word line being formed so as to cross the pair of driver transistors thereabove and being in contact with the gate layer of the pair of transfer transistors.

The second object of the present invention can be achieved by a semiconductor memory device wherein the word line includes a common word line for controlling the pair of transfer gates; and the common word line is connected to the gate layer of the pair of transfer transistors.

According to the present invention, a gate layer is additionally formed for a pair of transfer transistors, the associated gate line is formed above the gate layer. As a result no region is necessary for separation area between the word lines and the gate layer, and an area of a memory cell can be reduced.

According to the present invention, only one word line is necessary for one memory cell. As a result, an area of a memory cell can be further reduced.

DETAILED DESCRIPTION OF THE INVENTION

The semiconductor memory device according to a first embodiment of the present invention will be explained with reference to FIGS. 1 to 7.

Figure 1:
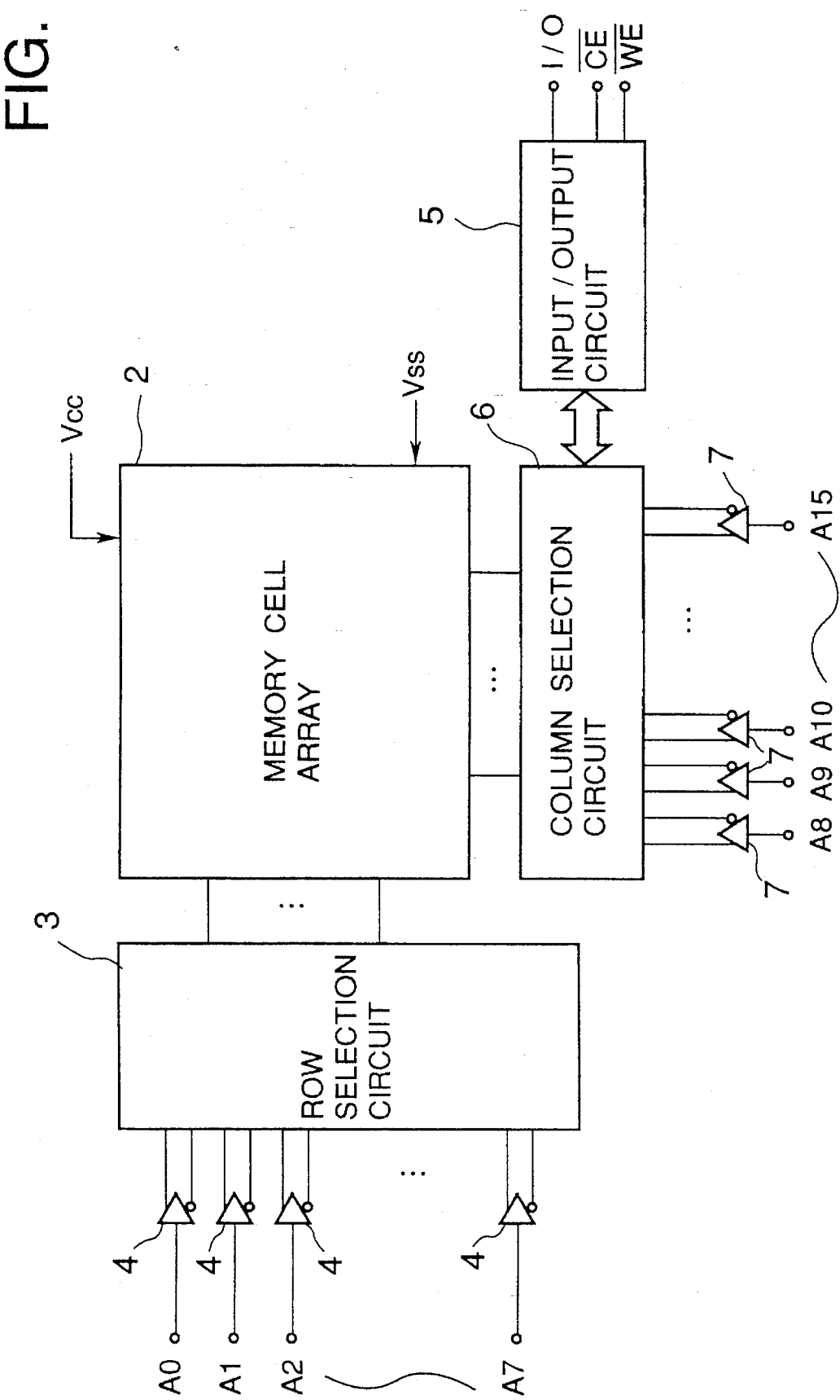
FIG. 1 is a circuit diagram of the semiconductor memory device according to a first embodiment of the present invention.

The semiconductor memory device according to the first embodiment includes, as shown in FIG. 1, a memory cell array 2 which comprises a matrix of a number of the memory cells which will be described later. The memory cell array 2 is supplied with a high-potential source power Vcc and a low-potential source power Vss as operational source power.

The memory cell array 2 includes a row selection circuit 3. The row selection circuit 3 is supplied with address signals A0–A7 of set bits through an address buffer 4, and decodes the inputted address signals A0–A7 and selects required word lines of the memory cell array 2.

The memory cell array 2 includes a column selection circuit 6. The column selection circuit 6 is supplied with address signals of set bits A8–A15, and decodes the inputted address signals A8–A15 and selects required bit lines of the memory cell array 2.

The column selection circuit 6 includes an input/output circuit 5 for inputting/outputting data. The input/output circuit 5 is supplied with an inverting signal $\overline{CS}$ of a chip select signal CS and an inverting signal $\overline{WE}$ of a write enable signal WE. The input/output circuit 5 receives and supplies an external data signal, when a chip select signal $\overline{CS}$ is of low level and whether a write enable signal $\overline{WE}$ is of low or high level.

Figure 2:
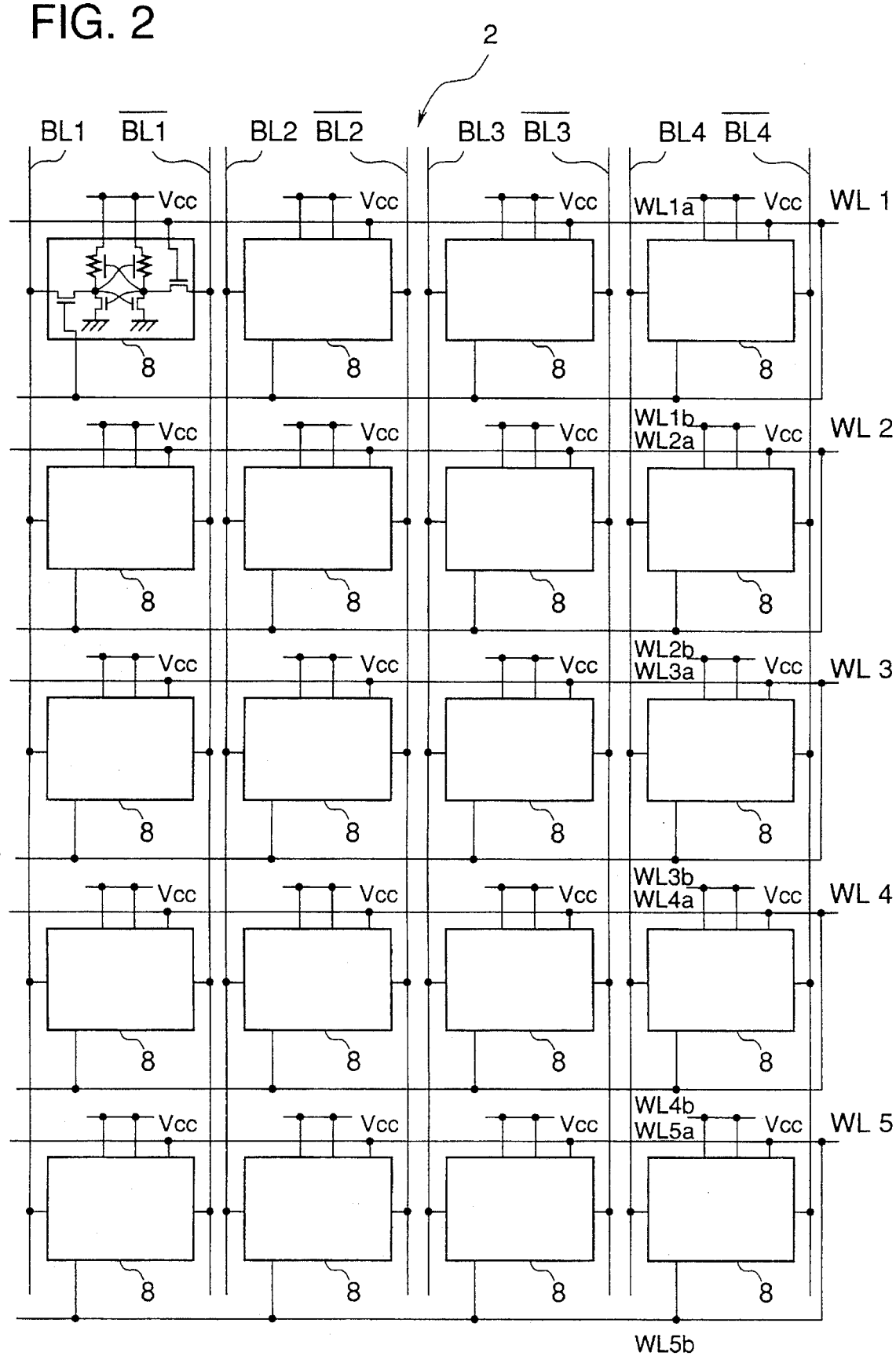
FIG. 2 is a circuit diagram of a memory array of the semiconductor memory device according to the first embodiment of the present invention.

As shown in FIG. 2, the memory cell array 2 comprises memory cells arranged in a matrix. Each memory cell 8 is supplied with a high-potential source power Vcc and a low-potential source power Vss as operational source power.

The memory cells 8 arranged in each row from the left to the right in FIG. 2 are connected to a common word line WL1, WL2, . . . Each word line WL1, WL2, . . . is branched in two word lines WL1a, WL1b; WL2b, WL2b; . . . which are wired to the associated memory cells 8.

The memory cells 8 arranged in each column up to down in FIG. 2 are connected to a pair of common bit lines BL1, $\overline{BL1}$; BL2, $\overline{BL2}$; . . .

Figure 3:
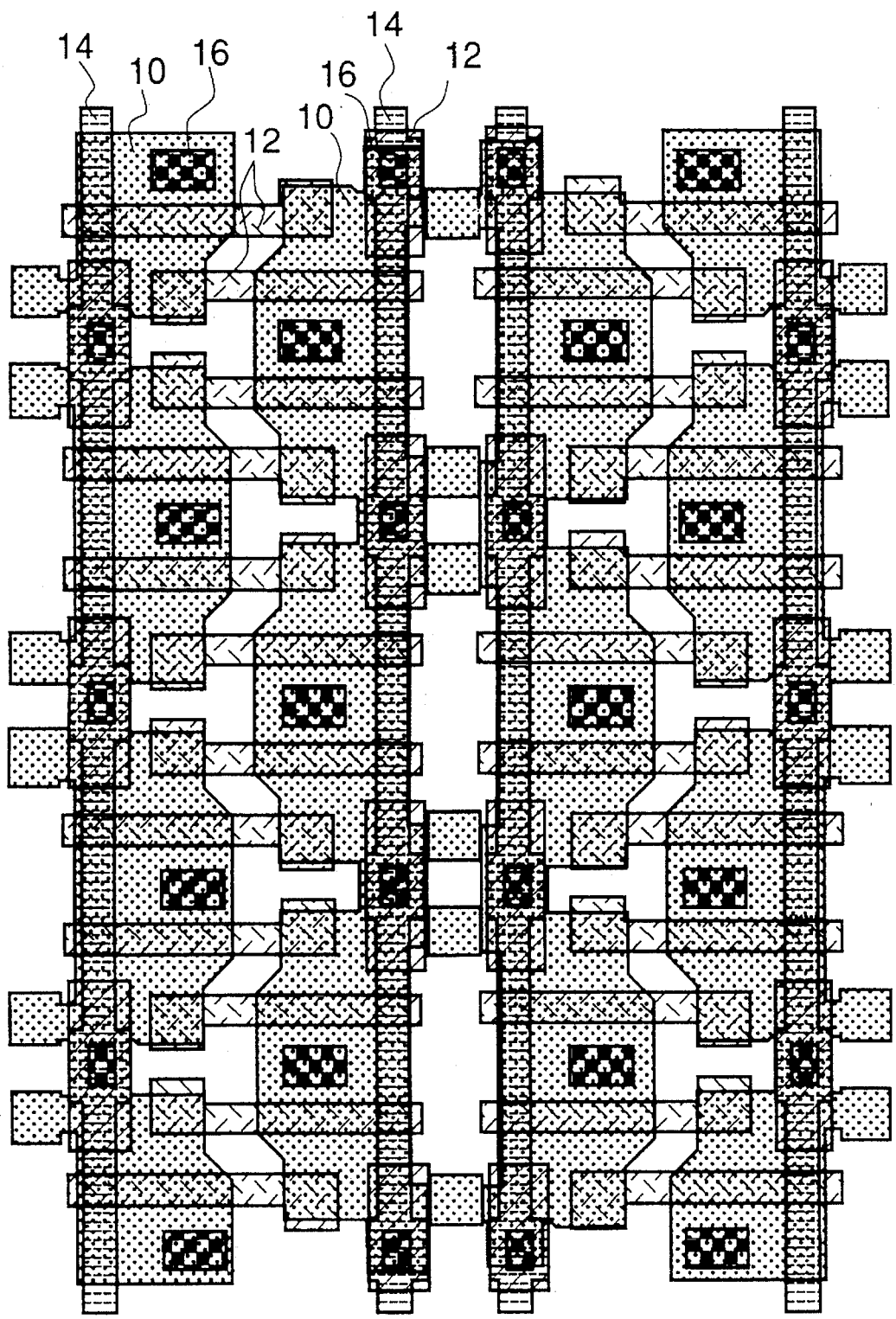
FIG. 3 is a view of a pattern of the memory cell array of the semiconductor memory device according to the first embodiment of the present invention.

A layout pattern of the memory cell array 2 is shown in FIG. 3. In the layout pattern of FIG. 3 device region patterns 10, polycrystalline silicon layer patterns 12 and word line patterns 14, and contact hole patterns 16 are drawn one on another.

Figure 4:
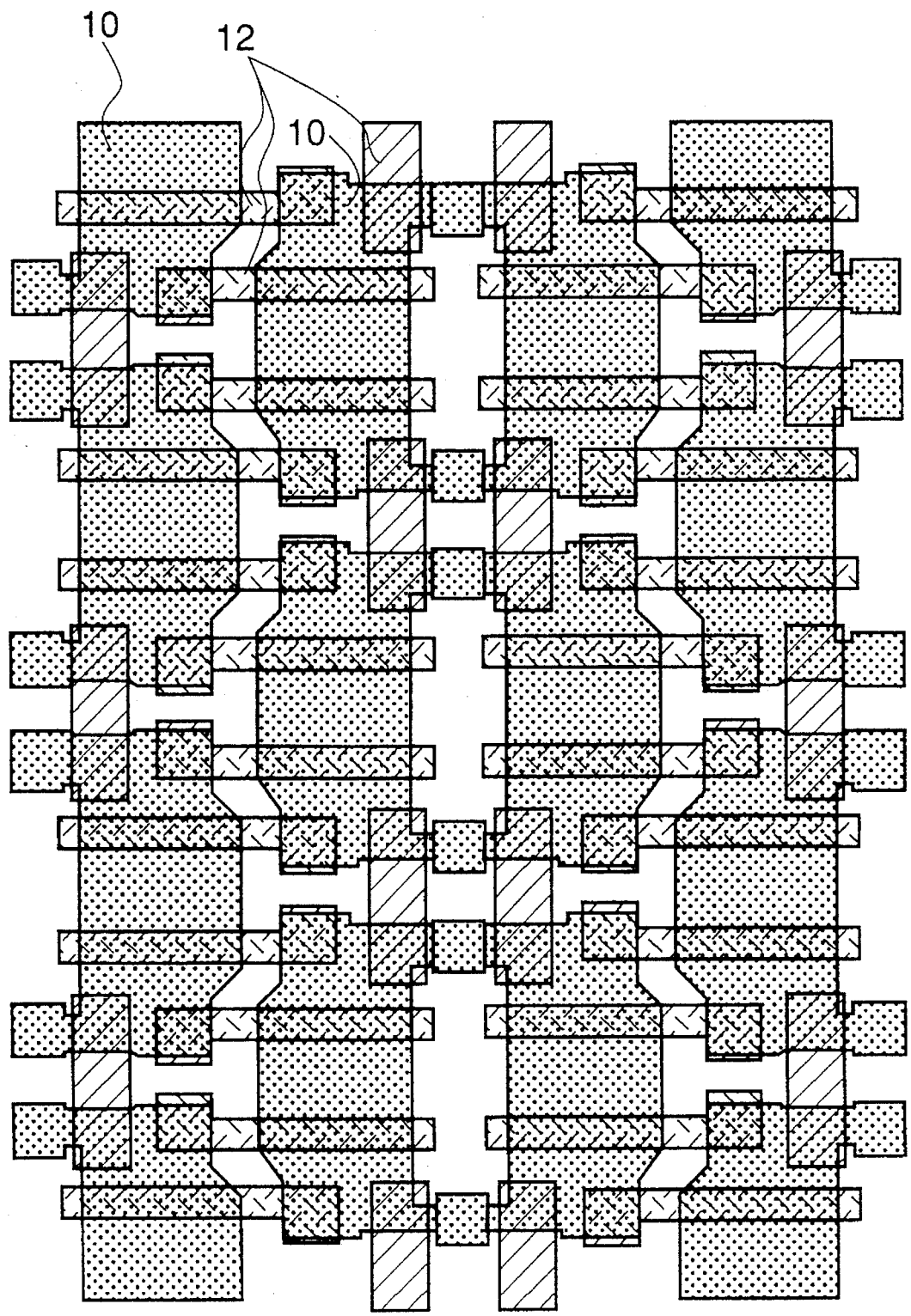
FIG. 4 is a view of device region and polycrystalline silicon layer patterns of the memory cell array of the semiconductor memory device according to the first embodiment.
Figure 5:
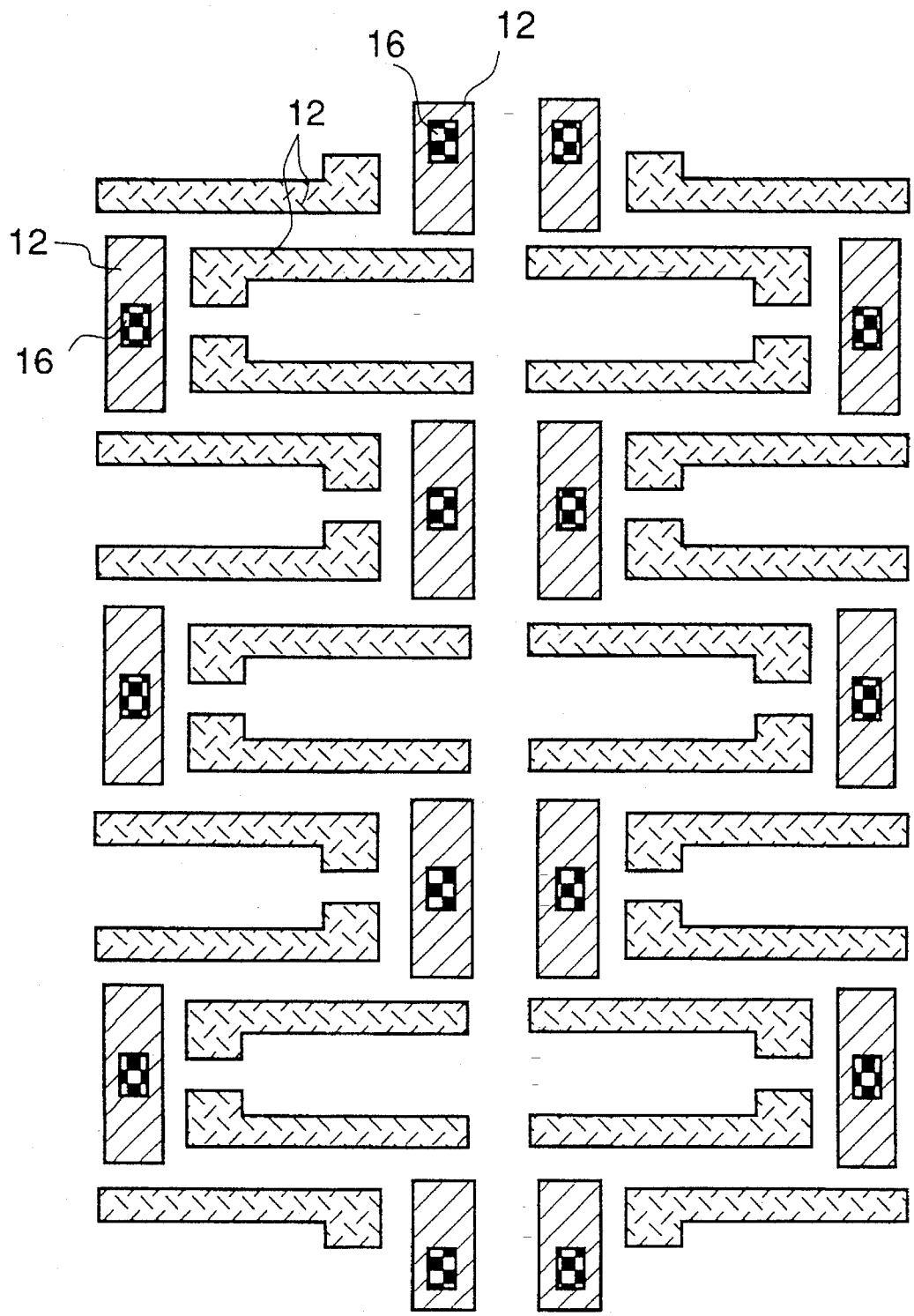
FIG. 5 is a view of polycrystalline silicon layer and contact hole patterns of the memory cell array of the semiconductor memory device according to the first embodiment.
Figure 6:
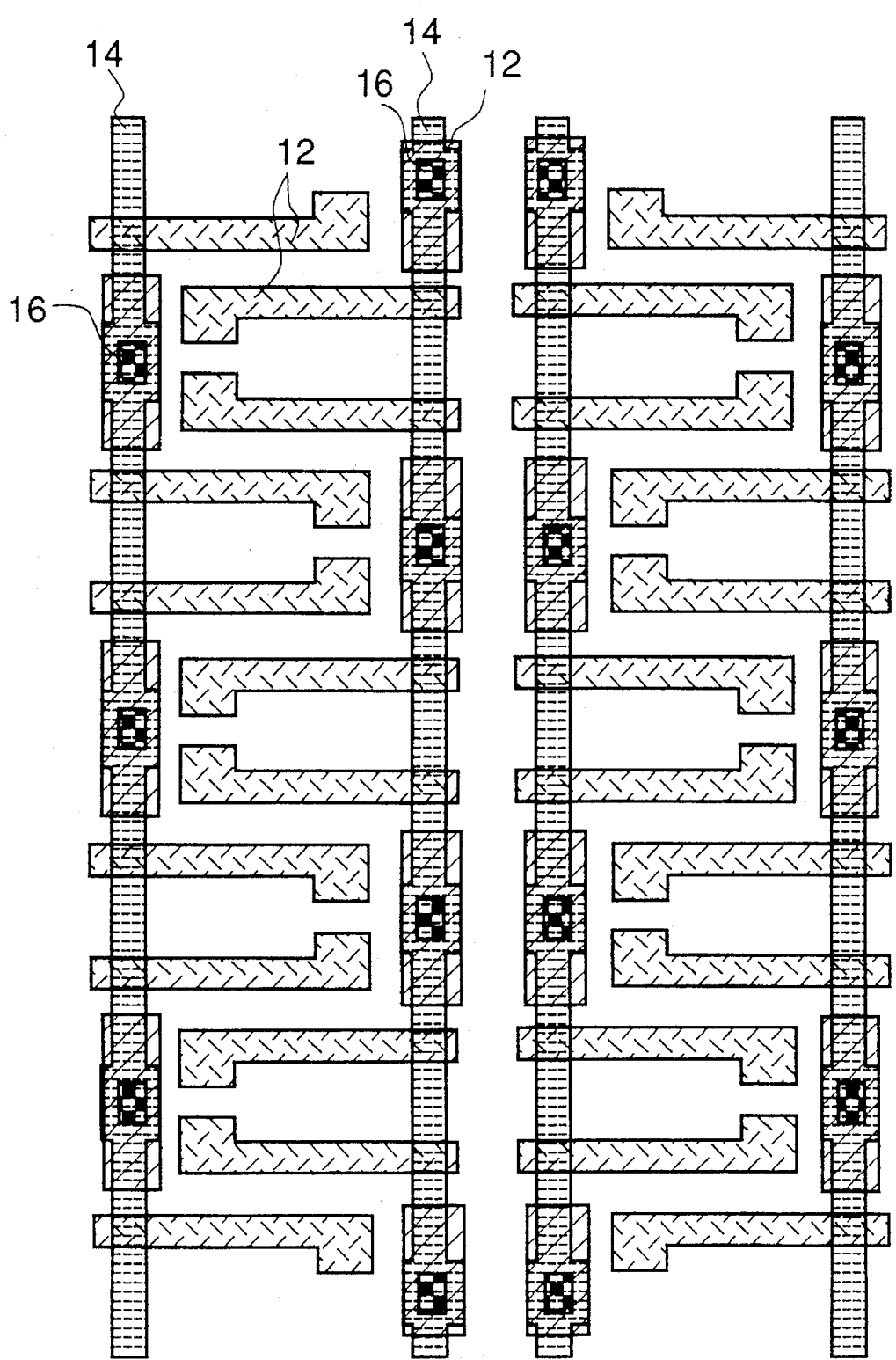
FIG. 6 is a view of the polycrystalline silicon layer pattern and a word line pattern of the memory cell array of the semiconductor memory device according to the first embodiment of the present invention.

FIGS. 4 to 6 facilitate the understanding of the layout pattern of the memory cell array 2. In FIG. 4 the device region patterns 10 and the polycrystalline silicon layer patterns 12 are superposed, in FIG. 5 the polycrystalline silicon layer patterns 12 and the contact hole patterns 16 are superposed, and in FIG. 6 the polycrystalline silicon layer patterns 12, the word line patterns 14 and the contact hole patterns 16 are superposed.

As shown in FIGS. 3 to 6, in this embodiment, the polycrystalline silicon layer patterns 12 which are to be drive transistors and gate layers of transfer transistors are formed on the device region pattern 10, and the word line patterns 14 which are to be the word lines are formed above the polycrystalline silicon layer patterns 12. Accordingly it is found that a size of the memory cells 8 is substantially the same as a size of the device region patterns 10 substantially without useless regions.

Figures 7A, 7B:
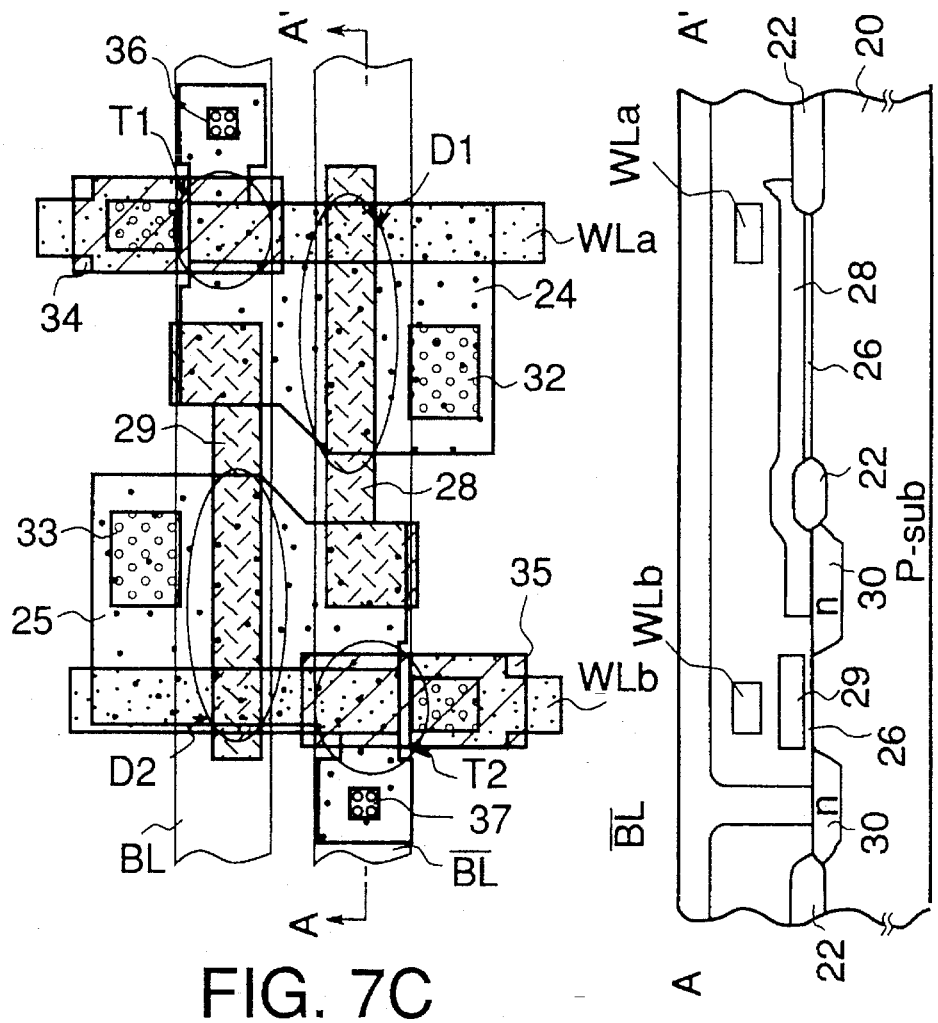
FIGS. 7A to 7C are views of the memory cell of the semiconductor memory device according to the first embodiment of the present invention.
Figure 7C:
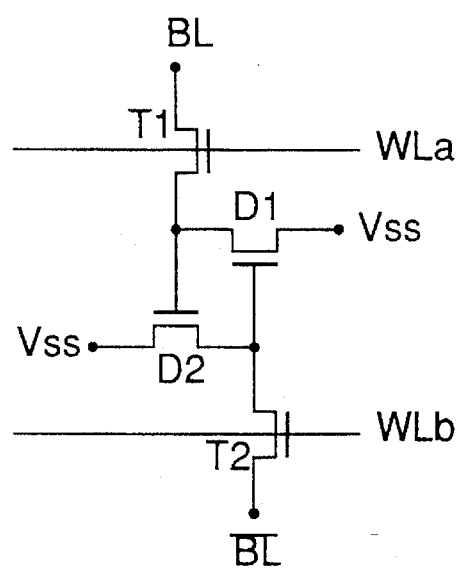

A structure of the memory cells according to this embodiment is shown in FIGS. 7A to 7C. FIG. 7A is a plan view of the memory cells. FIG. 7B is a sectional view of the memory cells along the line A–A'. FIG. 7C is a circuit diagram of the memory cells.

Each memory cell 8 includes a pair of device regions 24, 25 defined by a filed oxide film 22 on a p-semiconductor substrate 20. A driver transistor D1 and a transfer transistor T1 are formed in one of the device regions 24, and a driver transistor D2 and a transfer transistor T2 are formed in the other device region 25.

In the device region 24 a gate layer 28 (the polycrystalline silicon layer) of the driver transistor D1 is formed through a gate oxide film 26, and in the other device region 25 a gate layer 29 (the polycrystalline silicon layer) of the driver transistor D2 is formed through the gate oxide film 26. The gate layer 28 crosses the device region 24 forming the driver transistor D1 and arrives at the device region 25 to be in contact with an n-doped region 30 of the device region 25. Similarly the gate layer 29 crosses the device region 25 of the driver transistor D2 and arrives at the device region 24 to be in contact with an n-doped region 30 of the device region 24.

A Vss contact 32 which contacts the low-potential power source wire (not shown) is formed in the n-doped region 30 adjacent to the channel region of the driver transistor D1. Similarly a Vss contact 33 which contacts the low-potential power source wire (not shown) is formed in the n-doped region 30 adjacent to the channel region of the driver transistor D2 of the device region 25.

In the device region 24 a gate layer 34 (the polycrystalline silicon layer) of the transfer transistor T1 is formed through the gate oxide film 26. A word line WL$a$(a metal layer) is formed on the gate layer 34 across the memory cell 8 through a contact hole. In the device region 25 a gate layer 35 of the transfer transistor T2 is formed through the gate oxide film 26. A word line WL$b$(a metal layer) is formed on the gate layer 35 across the memory cell 8 through a contact hole.

A bit line contact 36 which contacts a bit line BL is formed in the n-doped region 30 adjacent to the channel region of the transfer transistor T1 of the device region 24. Similarly a bit line contact 37 which contacts a bit line BL is formed in the n-doped region 30 adjacent to the channel region of the transfer transistor T2.

The driver transistor D1, D2 of each memory cell includes a TFT (Thin Film Transistor) load device (not shown) thereabove.

Thus according to the first embodiment, the gate layers of the transfer transistors are additionally formed, and the word lines are formed above the gate layers. As a result, the word lines can be superposed on the gate layers without the necessity of useless regions for separation, and accordingly the device regions can be enlarged up to a full size of the memory cells.

According to the first embodiment, the transfer transistors of adjacent ones of the memory cells have the common gate layer and are contacted to a word line through a contact hole. As a result a number of the contact holes can be reduced by half, and an area of the memory cells can be decreased.

Accordingly an area of the memory cells can be decreased, while the driver transistors can have sufficient driving ability.

Furthermore, according to the first embodiment, the word lines are separate layers from the gate layers. As results, metal layers can be used, and the signals transmitted through the word lines have smaller delays to thereby operate the memory cells at higher speeds.

The semiconductor memory device according to a second embodiment of the present invention will be explained with reference to FIGS. 8 to 13. Common members of the second embodiment with the first embodiment have common reference numerals not to repeat or simplify their explanations.

Figure 8:
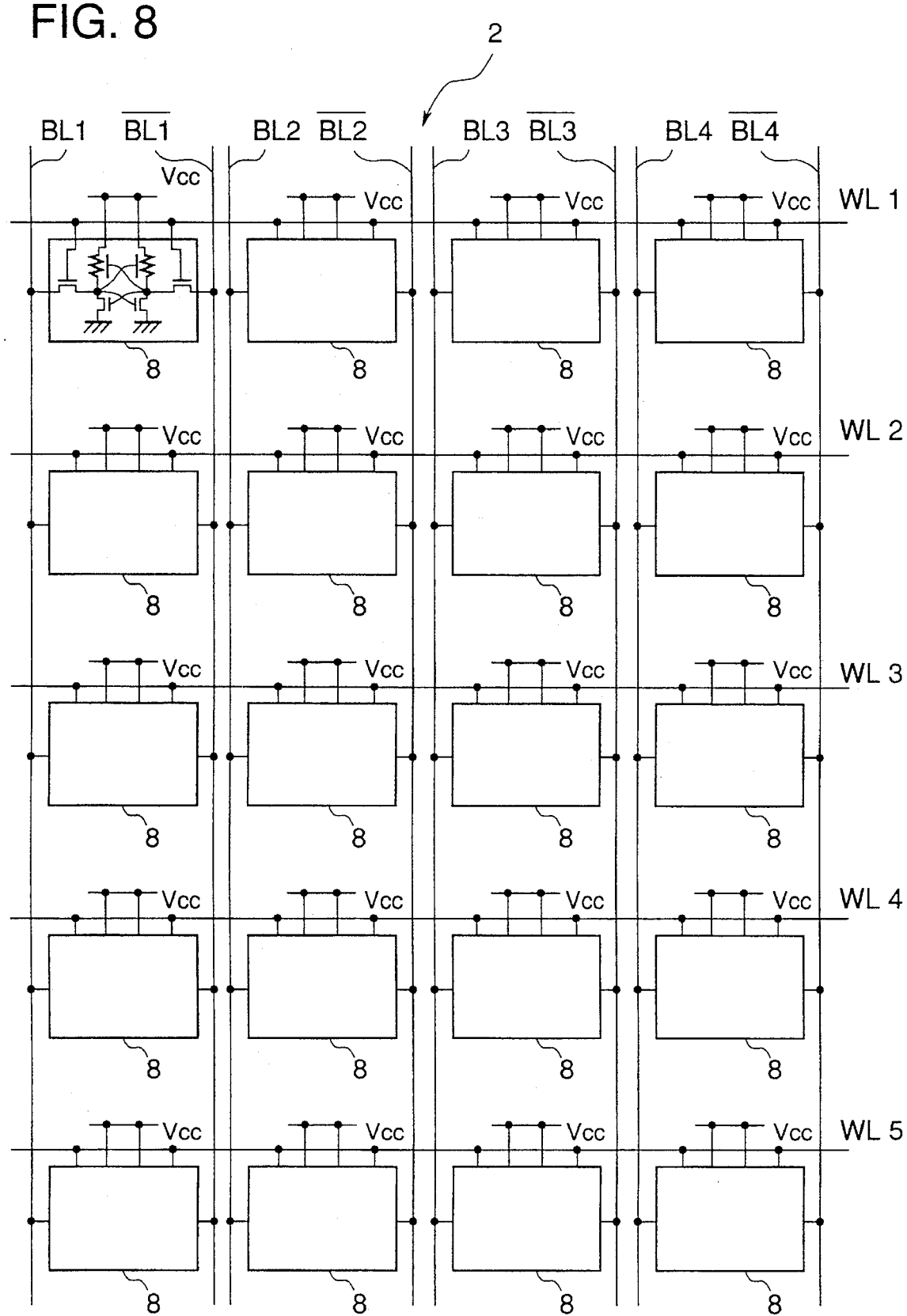
FIG. 8 is a circuit diagram of the memory cell array of the semiconductor memory device according to a second embodiment of the present invention.

As shown in FIG. 8, the memory cell array 2 comprises memory cells 8 arranged in a matrix. Each memory cell 8 is supplied with a high-potential source power Vcc and a low-potential source power Vss as operational source power.

The memory cells 8 arranged in each row from the left to the right in FIG. 8 are connected to a common word line WL1, WL2, . . . Each word line WL1, WL2, . . . is connected to the memory cells 8 of each row.

The memory cells 8 arranged in each column up to down in FIG. 2 are connected to a pair of common bit lines BL1, $\overline{BL1}$; BL2, $\overline{BL2}$; . . .

Figure 9:
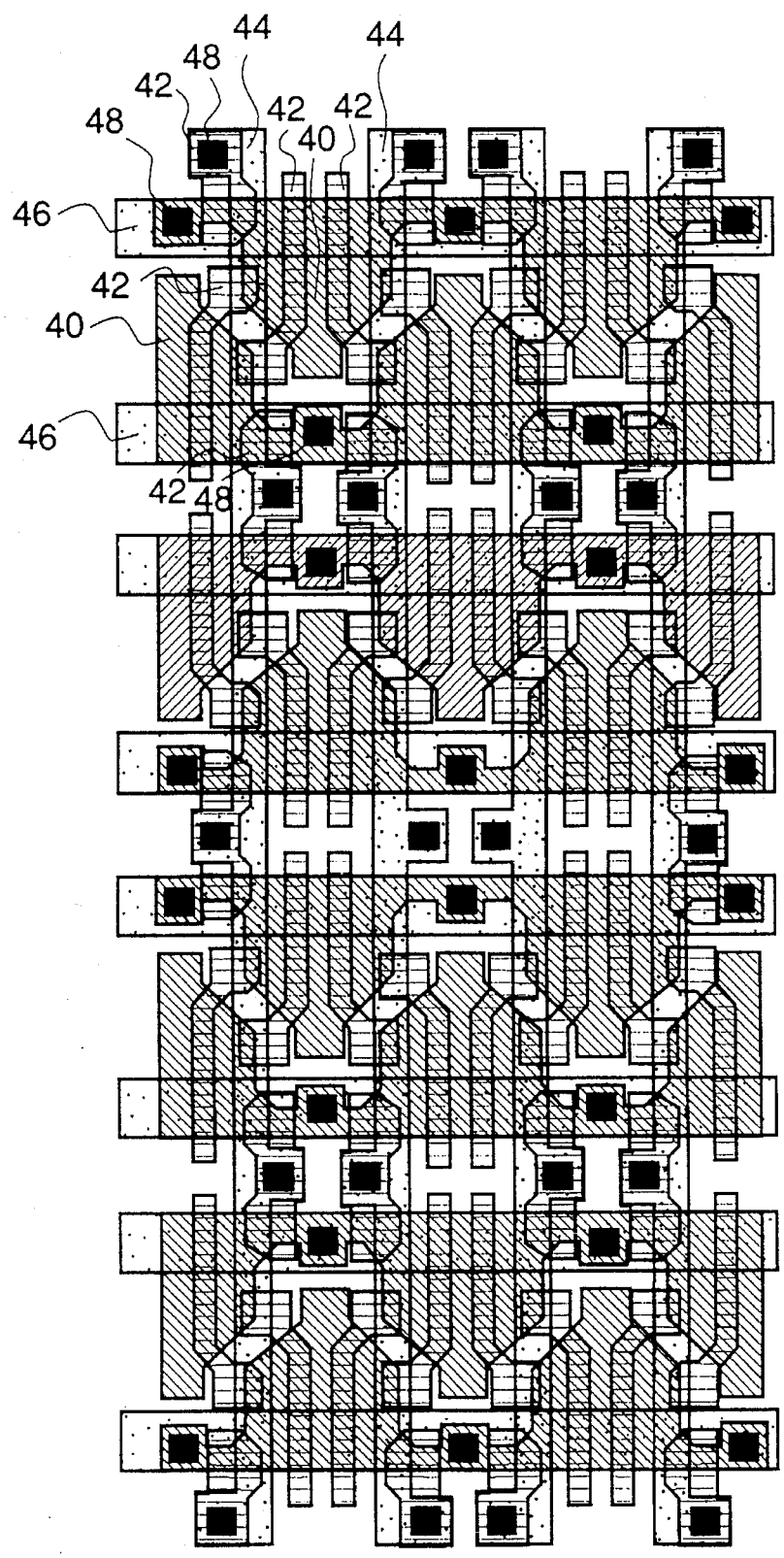
FIG. 9 is a view of a pattern of the memory cell array of the semiconductor memory device according to the second embodiment of the present invention.

A layout pattern of the memory cell array 2 is shown in FIG. 9. In the layout pattern of FIG. 9, device region patterns 40, polycrystalline silicon layer patterns 42, word line patterns 44, bit line patterns 46 and contact hole patterns 48 are drawn one on another.

Figure 10:
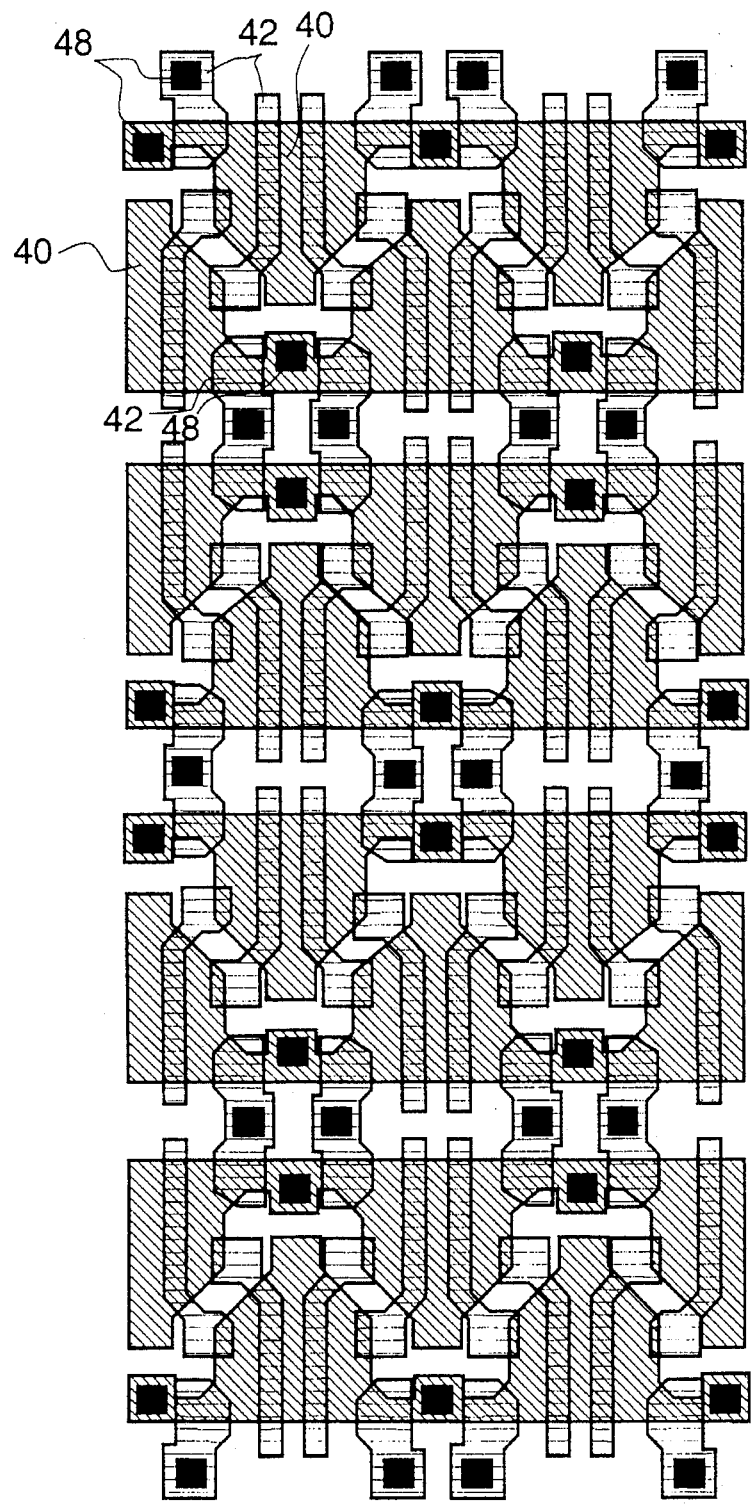
FIG. 10 is a view of device region, polycrystalline silicon layer and contact hole patterns of the memory cell array of the semiconductor memory device according to the second embodiment of the present invention.
Figure 11:
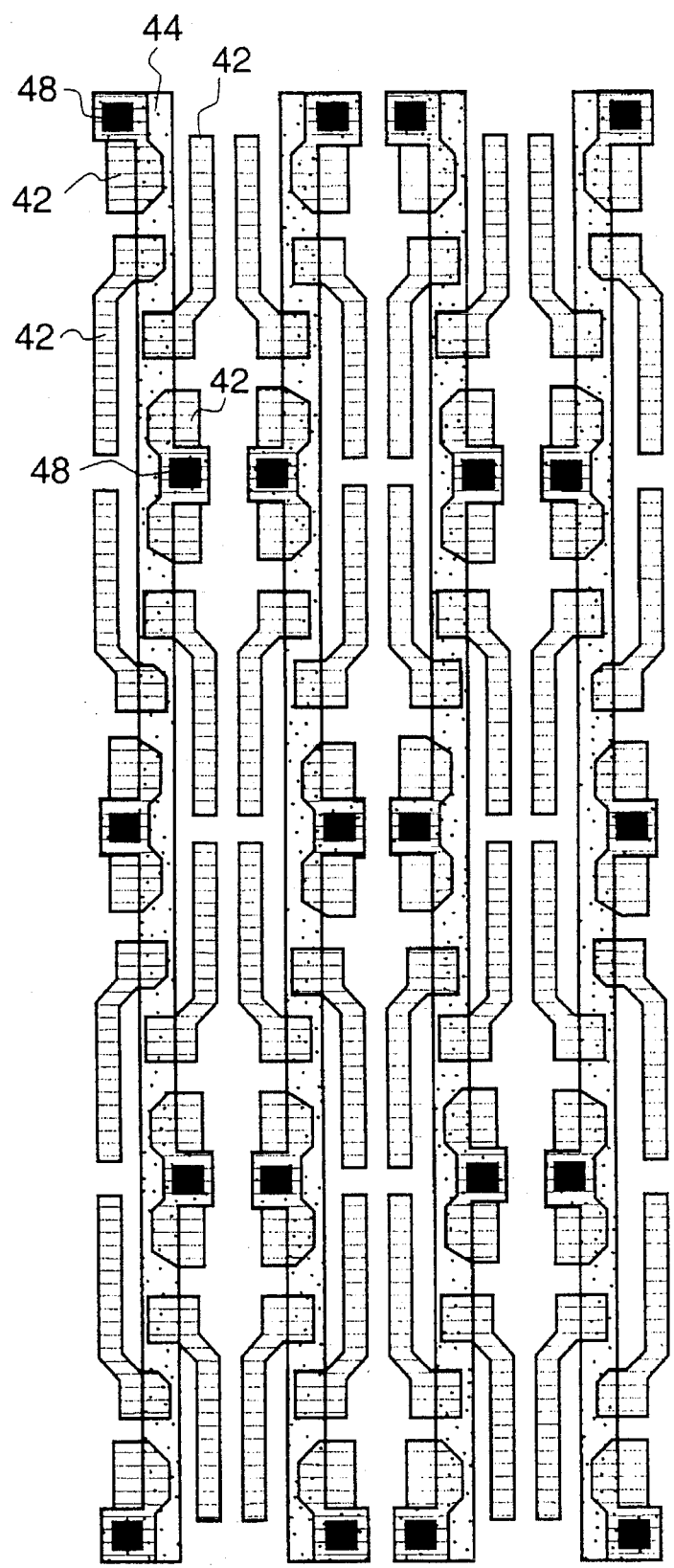
FIG. 11 is a view of the polycrystalline silicon layer pattern, and a word 1 line pattern, and the contact hole patterns of the memory cell array of the semiconductor memory device according to the second embodiment of the present invention.
Figure 12:
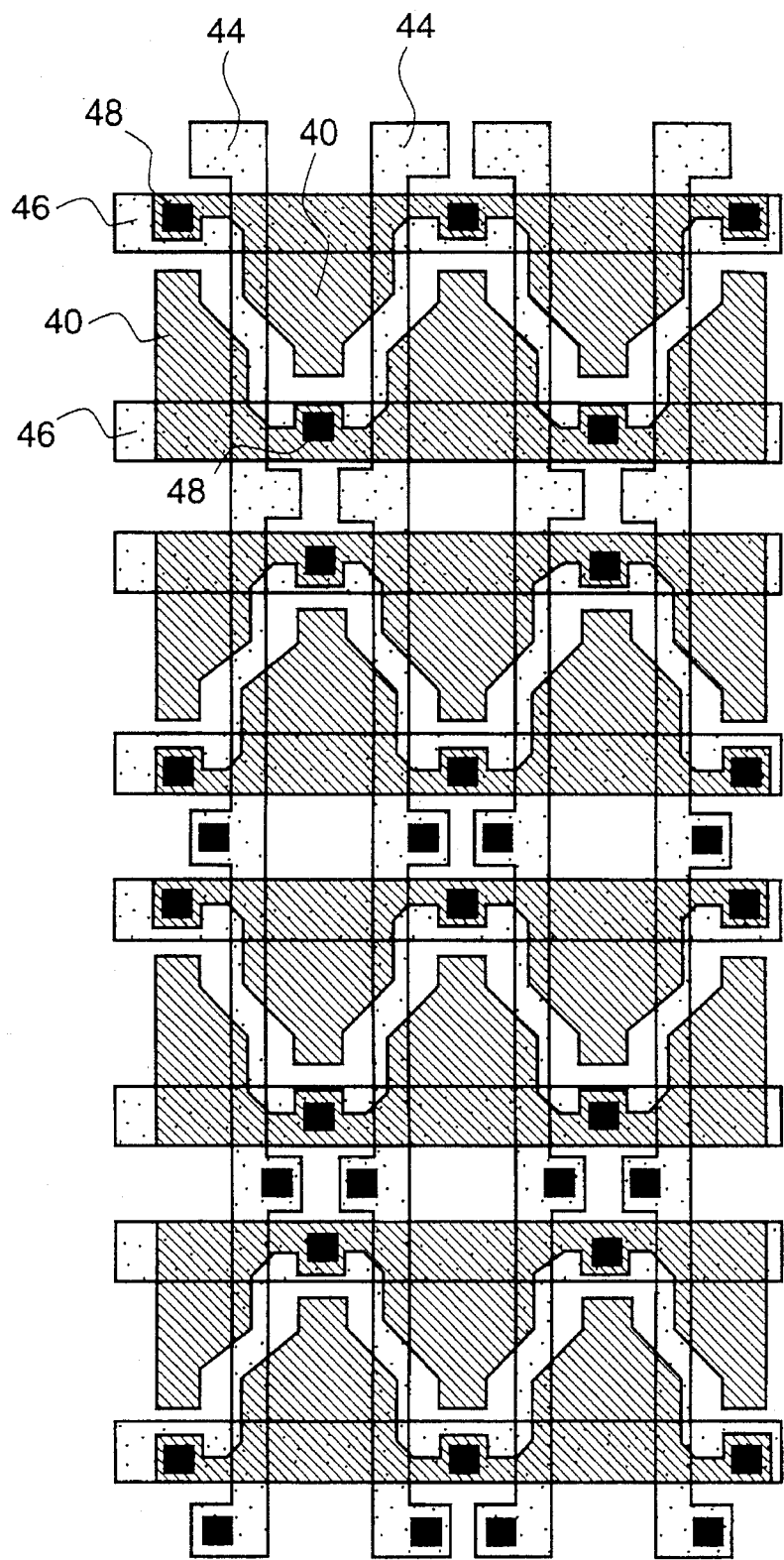
FIG. 12 is a view of the word line pattern, a bit line pattern, and the contact hole pattern of the memory cell array of the semiconductor memory device according to the second embodiment.

FIGS. 10 to 12 facilitate the layout pattern of the memory cell array 2. In FIG. 10 the device region patterns 40, the polycrystalline silicon layer patterns 42 and the contact hole patterns 48 are superposed on one another. In FIG. 11 the polycrystalline silicon layer patterns 42, the word line patterns 44 and the contact hole patterns 48 are superposed on one another. In FIG. 12 the word line patterns 44, the bit line patterns 46 and the contact hole patterns 48 are superposed.

As shown in FIGS. 10 to 12, the memory cell according to this embodiment has a rectangular shape having longer sides along the word line WL than those along the bit line BL. Only one word line WL is provided for one memory cell 8.

In the memory cell 8 according to this embodiment, the polycrystalline silicon layer patterns 42 which are to be a driver transistor and a gate layer of a transfer transistor is formed on the device region patterns 40, the word line patterns 44 which are to be the word lines is formed above the polycrystalline silicon layer patterns 42, and the bit line patterns 46 are formed above the word line patterns 44. Accordingly it is seen that a size of the memory cells 8 is substantially the same as a size of the device region patterns 40, and the memory cells 8 can have smaller sizes substantially without useless regions.

Figure 13A:
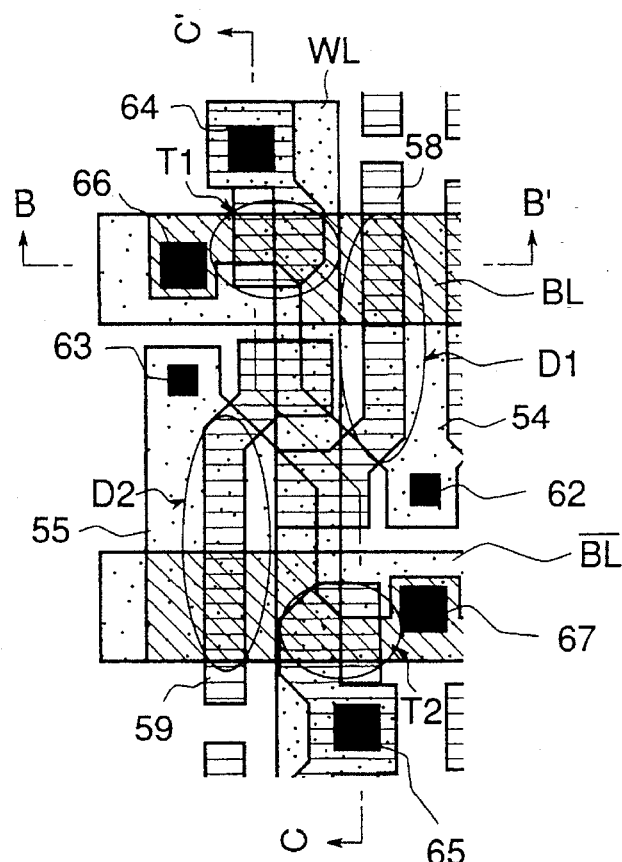
FIGS. 13A to 13D are views of a memory cell of the semiconductor memory device according to the second embodiment of the present invention.
Figure 13C:
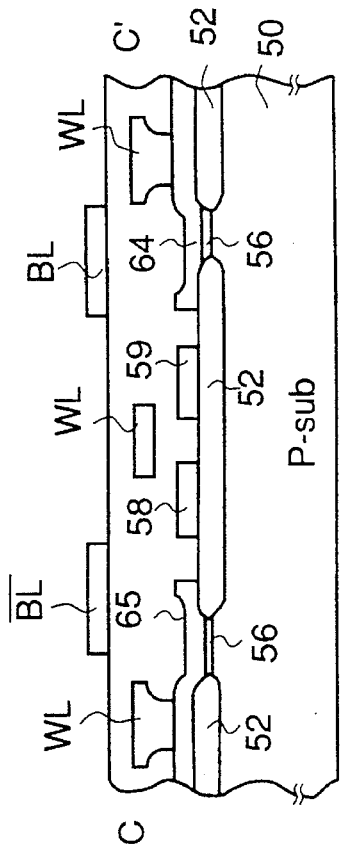
Figure 13B:
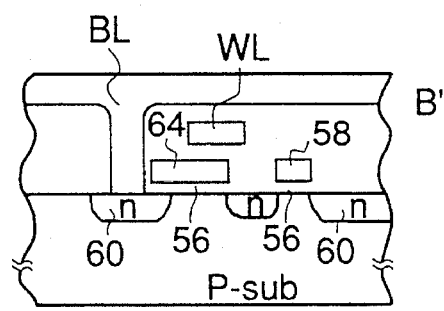
Figure 13D:
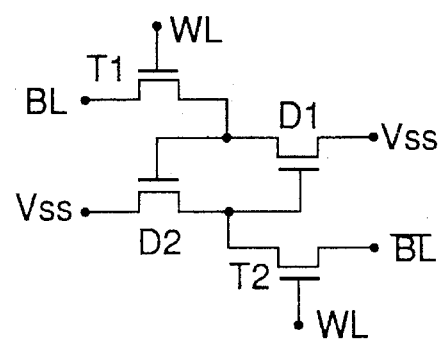

A structure of the memory cells according to this embodiment will be shown with reference to FIGS. 13A to 13D. FIG. 13A is a plan view of the memory cells. FIG. 13B is a sectional view of the memory cells along the line B–B'. FIG. 13C is a sectional view of the memory cells along the line C–C'. FIG. 13D is a circuit diagram of the memory cells.

Each memory cell 8 includes a pair of device regions 54, 55 defined by a field oxide film 52 on a p-semiconductor substrate 50. In one of the device regions 54 a driver transistor D1 and a transfer transistor T1 are formed, and in the other device region 55 a driver transistor D2 and a transfer transistor T2 are formed.

In the device region 54 a gate layer 58 (the polycrystalline layer) of the driver transistor D1 is formed through a gate oxide film 56, and in the device region 55 a gate layer 59 (the polycrystalline silicon layer) of the driver transistor D2 is formed through a gate oxide film 56. The gate layer 58 crosses the device region 54 which is to form the driver transistor D1 and arrives at the device region 55 to contact an n-doped region 60 of the device region 55. Similarly the gate layer 59 crosses the device region 55 which is to form the driver transistor D2 and arrives at the device region 54 to contact the n-doped region 60 of the device region 54.

A Vss contact 62 which contacts a power source wire (not shown) is formed in the n-doped region 60 adjacent to the channel region of the driver transistor D1 of the device region 54. Similarly a Vss contact 63 which contact a power source wire (not shown) is formed in the n-doped region 60 adjacent to the channel region of the driver transistor D2 of the device region 55.

A gate layer 64 (the polycrystalline silicon layer) of the transfer transistor T1 is formed in the device region 54 through the gate oxide film 56. The gate layer 65 of the transfer transistor T2 is formed through the gate oxide film 56 in the device region 55. A metal layer which forms the word lines WL is formed above the polycrystalline silicon layer forming the gate layers 64, 65.

The gate layers 64, 65 (the polycrystalline silicon layer) of the transfer transistors T1, T2 are connected commonly to one world line WL (the metal layer). The word line WL is formed so as to cross the memory cell 8.

The bit line contact 66 which contacts the bit line BL is formed in the n-doped region 60 adjacent to the channel region of the transfer transistor T1 of the device region 54. Similarly a bit line contact 67 which contacts the bit line BL is formed in the n-doped region 60 adjacent to the channel region of the transfer transistor T2 of the device region 55.

Thus according to the second embodiment, the gate layers of the transfer transistors are additionally formed, and the word lines are formed above the gate layers. As a result, the word lines can be superposed on the gate layers without the necessity of useless regions for separation, and accordingly the device regions can be enlarged up to a full size of the memory cells.

According to the second embodiment, the transfer transistors of adjacent ones of the memory cells have the common gate layer and are contacted to a word line through a contact hole. As a result a number of the contact holes can be reduced by half, and an area of the memory cells can be decreased.

Accordingly an area of the memory cells can be decreased, while the driver transistors can have sufficient driving ability.

Furthermore, according to the second embodiment, the word lines are separate layers from the gate layers. As results, metal layers can be used, and the signals transmitted through the word lines have smaller delays to thereby operate the memory cells at higher speeds.

In addition, according to the second embodiment, the memory cells have a rectangular shape whose sides along the word lines are longer than those along the bit lines. As a result, the bit lines can have wide pitches, and accordingly the bit lines can be wider, and can have low resistances. The memory cells can operate at high speed.

The rectangular shape of the memory cells whose sides along the word lines are longer than those along the bit lines allows a length of the bit lines per one memory cell can be reduced, whereby the bit lines of the memory cell array can have low resistances and low capacities. The memory cells can operate at higher speed.

Then, a method for minimizing an operational time difference due to a delay of a signal inputted to the word lines or the bit lines will be explained with reference to FIGS. 14A to 14C.

Figure 14A:
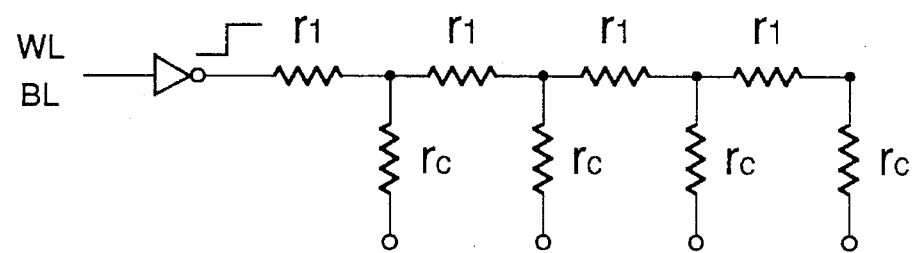
FIGS. 14A to 14C are views explaining the signal delay of the word lines or the bit lines of the semiconductor memory device according to the present invention.

What are involved in a delay of a signal transmitted to the signal lines, such as the word lines, the bit lines, etc. are considered to be a resistance rl of a signal line per se and a contact resistance rc of a signal line per a cell, and signals are considered to be transmitted through the resistor circuit of FIG. 14A. The signals transmitted through the signal line are gradually delayed. The resistance rl is a resistance of the memory cells associated with the signal line.

Figure 14B:

When a resistance value of the contact resistance rc is larger than a resistance value of the resistance rl, as shown in FIG. 14B signals are generally delayed, but their waveforms are substantially the same. Accordingly in the semiconductor memory device according to the present invention, which operates when signals transmitted through the signal lines reach a set threshold value, a delay in an operational time of the transfer transistors of the memory cells can be suppressed to be small.

Figure 14C:
Figure 15:
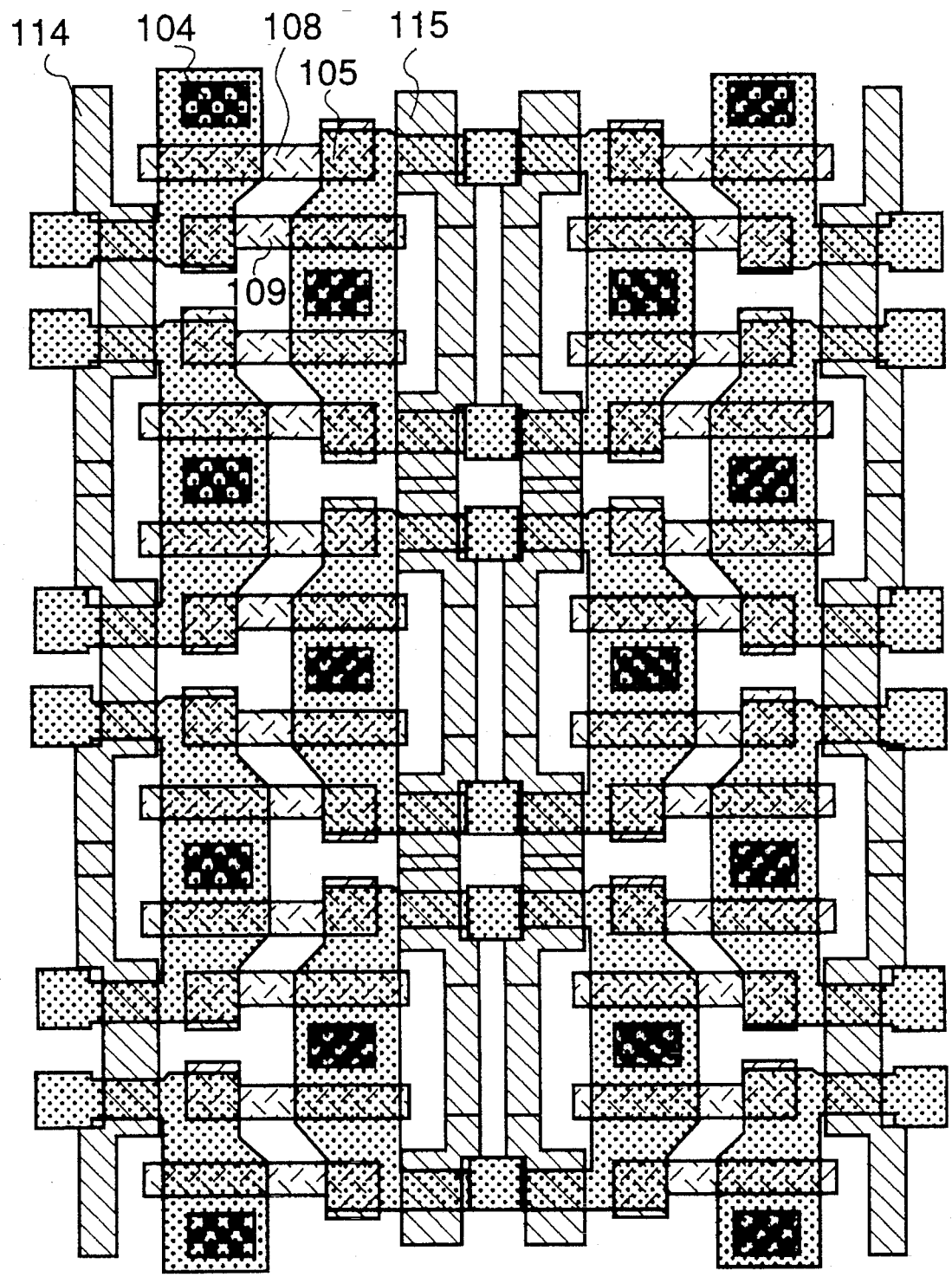
FIG. 15 is a view of a pattern of a memory array of the conventional semiconductor memory device.
Figure 16A:
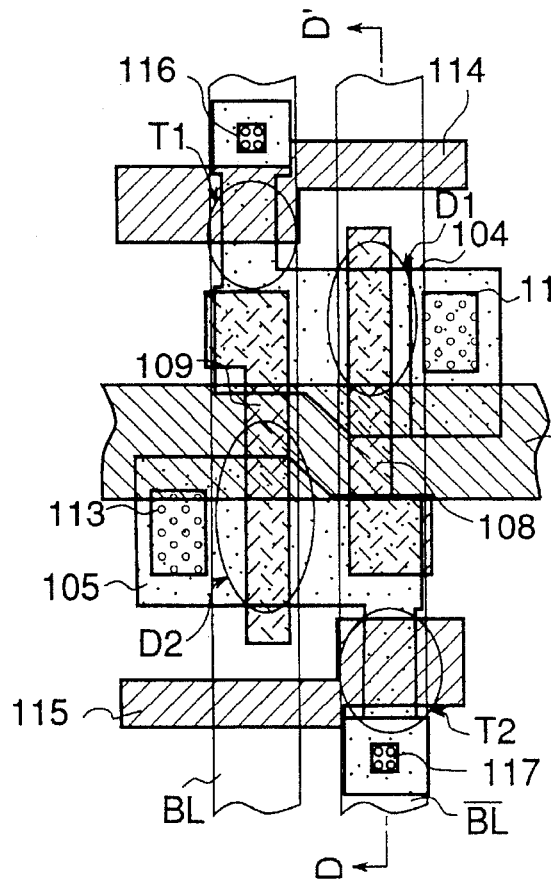
FIGS. 16A to 16C are views of a memory cell of the conventional semiconductor memory device.
Figure 16B:
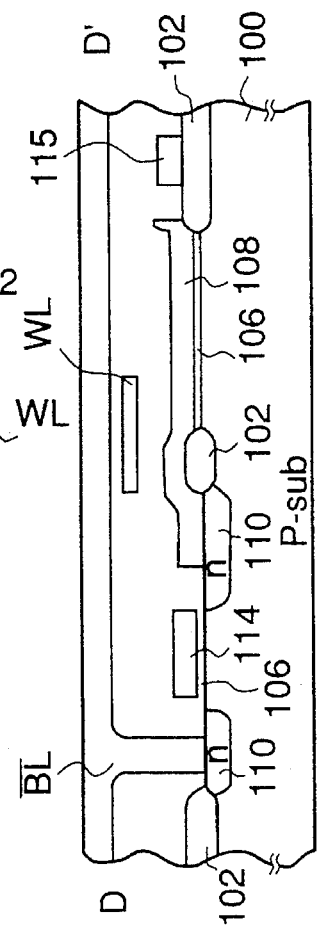
Figure 16C:
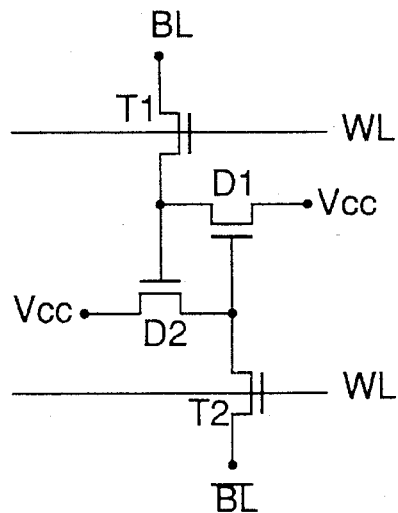

Reversely when a resistance value of the contact resistance rc is smaller than a resistance value of the resistance rl, as shown in FIG. 14C delayed signals have gradually changed waveforms. Accordingly a delay in an operational time of the transfer transistors of the memory cells increases.

The present invention is not limited to the above-described embodiments and covers variations and modifications. For example, in the above-described embodiments, TFT load devices are used, but load devices of other types may be used.

What is claimed is:

1. A semiconductor memory device, comprising:
   a layout of a plurality of memory cells each including a pair of device regions;
   a pair of driver transistors respectively formed on a respective device region of the pair of device regions and having gates and drains thereof cross-connected to each other;
   a pair of transducer transistors respectively formed on the respective device region of the pair of device regions and controlled by a word line; and
   a pair of load device respectively disposed in a respective driver transistor of the pair of driver transistors,
   wherein the pair of transfer transistors has a gate layer formed on the pair of device regions, and
   wherein said word line is formed so as to cross the pair of driver transistors thereabove and is in contact with the gate layer of the pair of transfer transistors through a contact hole in each of the memory cells.

2. A semiconductor memory device, comprising:
   a layout of a plurality of memory cells each including a pair of device regions;
   a pair of driver transistors respectively formed on a respective device region of the pair of device regions and having gates and drains thereof cross-connected to each other;
   a pair of transfer transistors respectively formed on the respective device region of the pair of device regions and controlled by a word line; and
   a pair of load devices respectively disposed in a respective driver transistor of the pair of driver transistors,
   wherein the pair of transfer transistors has a gate layer formed on the pair of device regions, and
   wherein said word line is formed so as to cross the pair of transfer transistors thereabove and is in contact with the gate layer of the pair of transfer transistors through a contact hole in each of the memory cells.

3. A semiconductor memory device according to claim 1, wherein said word line includes a pair of word lines for respectively controlling the respective transfer transistor of the pair of transfer transistors, and
   wherein said word line of the pair of said word lines is respectively connected to said gate layer of the pair of transfer transistors.

4. A semiconductor memory device according to claim 2, wherein said word line includes a pair of word lines for respectively controlling the respective transfer transistor of the pair of transfer transistors, and wherein said word line of said pair of word line is respectively connected to the gate layer of the pair of transfer transistors.

5. A semiconductor memory device according to claim 3, further comprising a pair of bit lines respectively connected to current terminals of the respective transfer transistor of said pair of transfer transistors, and wherein said pair of bit lines passes above said pair of word lines substantially normally thereto.

6. A semiconductor memory device according to claim 4, further comprising a pair of bit lines respectively connect to current terminals of the respectively transfer transistor of said pair of transfer transistors, and wherein said pair of bit lines passes above said pair of word lines substantially normally thereto.

7. A semiconductor memory device according to claim 1, wherein said word line includes a common word line for controlling said pair of transfer transistors, and wherein said common word line is connected to the gate layer of said pair of transfer transistors.

8. A semiconductor memory device according to claim 2, wherein said word line includes a common word line for controlling said pair of transfer transistors, and wherein said common word line is connected to the gate layer of said pair of transfer transistors.

9. A semiconductor memory device according to claim 7, further comprising a pair of bit lines respectively connected to current terminals of the respective transfer transistors of the pair transfer transistors, wherein said pair of bit lines passes the common word line thereabove substantially normally thereto.

10. A semiconductor memory device according to claim 8, further comprising a pair of bit lines respectively connected to current terminals of the respective transfer transistor of the pair of transfer transistors, wherein said pair of bit lines passes the common word line thereabove substantially normally thereto.

11. A semiconductor memory device according to claim 7, wherein the memory cell has a rectangular shape having longer sides along the common word line than sides along the pair of bit lines.

12. A semiconductor memory device according to claim 8, wherein the memory cell has a rectangular shape having longer sides along the common word line than sides along the pair of bit lines.

13. A semiconductor memory device according to claim 9, wherein the memory cell has a rectangular shape having longer sides along the common word line than sides along the pair of bit lines.

14. A semiconductor memory device according to claim 10, wherein the memory cell has a rectangular shape having longer sides along the common word line than sides along the pair of bit lines.

15. A semiconductor memory device according to claim 1, wherein an ohmic layer with a larger resistance value per one memory cell than that of the word lines is formed in contact parts between the word lines and voltage terminals of the pair of transfer transistors.

16. A semiconductor memory device according to claim 2, wherein an ohmic layer with a larger resistance value per one memory cell than that of the word lines is formed in contact parts between the word lines and voltage terminals of the pair of transfer transistors.

17. A semiconductor memory device according to claim 3, wherein an ohmic layer with a larger resistance value per one memory cell than that of the word lines is formed in contact parts between the word lines and voltage terminals of the pair of transfer transistors.

18. A semiconductor memory device according to claim 4, wherein an ohmic layer with a larger resistance value per one memory cell than that of the word lines is formed in contact parts between the word lines and voltage terminals of the pair of transfer transistors.

19. A semiconductor memory device according to claim 5, wherein an ohmic layer with a larger resistance value per one memory cell than that of the word lines is formed in contact parts between the word lines and voltage terminals of the pair of transfer transistors.

20. A semiconductor memory device according to claim 6, wherein an ohmic layer with a larger resistance value per one memory cell than that of the word lines is formed in contact parts between the word lines and voltage terminals of the pair of transfer transistors.

21. A semiconductor memory device according to claim 7, wherein an ohmic layer with a larger resistance value per one memory cell than that of the word lines is formed in contact parts between the word lines and voltage terminals of the pair of transfer transistors.

22. A semiconductor memory device according to claim 8, wherein an ohmic layer with a larger resistance value per one memory cell than that of the word lines is formed in contact parts between the word lines and voltage terminals of the pair of transfer transistors.

23. A semiconductor memory device according to claim 9, wherein an ohmic layer with a larger resistance value per one memory cell than that of the word lines is formed in contact parts between the word lines and voltage terminals of the pair of transfer transistors.

24. A semiconductor memory device according to claim 10, wherein an ohmic layer with a larger resistance value per one memory cell than that of the word lines is formed in contact parts between the word lines and voltage terminals of the pair of transfer transistors.

25. A semiconductor memory device according to claim 11, wherein an ohmic layer with a larger resistance value per one memory cell than that of the word lines is formed in contact parts between the word lines and voltage terminals of the pair of transfer transistors.

26. A semiconductor memory device according to claim 12, wherein an ohmic layer with a larger resistance value per one memory cell than that of the word lines is formed in contact parts between the word lines and voltage terminals of the pair of transfer transistors.

27. A semiconductor memory device according to claim 13, wherein an ohmic layer with a larger resistance value per one memory cell than that of the word lines is formed in contact parts between the word lines and voltage terminals of the pair of transfer transistors.

28. A semiconductor memory device according to claim 14, wherein an ohmic layer with a larger resistance value per one memory cell than that of the word lines is formed in contact parts between the word lines and voltage terminals of the pair of transfer transistors.

* * * * *